(12) United States Patent
Koukab et al.

(10) Patent No.: US 7,692,500 B1
(45) Date of Patent: Apr. 6, 2010

(54) APPARATUS AND METHODS FOR MIXED ANALOG-DIGITAL FREQUENCY SYNTHESIZING AND MODULATION

(75) Inventors: Adil Koukab, St-Prex (CH); Michel Declercq, Penthaz (CH)

(73) Assignee: Marvell International, Ltd., Hamilton (BM)

( * ) Notice: Subject to any disclaimer, the term of this patent is extended or adjusted under 35 U.S.C. 154(b) by 61 days.

(21) Appl. No.: 12/175,570

(22) Filed: Jul. 18, 2008

Related U.S. Application Data

(60) Provisional application No. 60/950,692, filed on Jul. 19, 2007.

(51) Int. Cl.
| | |
|---|---|
| G01R 23/00 | (2006.01) |
| H03B 5/12 | (2006.01) |
| H03C 3/06 | (2006.01) |
| H03C 3/09 | (2006.01) |
| H03L 7/00 | (2006.01) |
| H03L 7/08 | (2006.01) |
| H03L 7/099 | (2006.01) |

(52) U.S. Cl. .................. 331/17; 331/1 A; 331/36 C; 331/44; 331/179; 332/127
(58) Field of Classification Search ............ 331/1 A, 331/8, 10–12, 16–18, 25, 36 C, 44, 179; 327/156–159; 332/127; 360/51; 375/376; 455/260
See application file for complete search history.

(56) References Cited

U.S. PATENT DOCUMENTS 6,734,741 B2 * 5/2004 Staszewski et al. ....... 331/36 C

2007/0040617 A1   2/2007  Koukab et al.

FOREIGN PATENT DOCUMENTS

EP   1 564 890 A1   2/2004

OTHER PUBLICATIONS

An Embedded 240-mW 10-b 50-MS/s CMOS ADC in 1-mm²; Klaas Bult and Aaron Buchwald; IEEE Journal of Solid-State Circuits, vol. 32, No. 12, Dec. 1997; pp. 1887-1895.
A 2.5-Mb/s GFSK 5.0-Mb/s 4-FSK Automatically Calibrated Σ-Δ Frequency Synthesizer; Daniel R. McMahill, Student Member, IEEE, and Charles G. Sodini, Fellow, IEEE; IEEE Journal of Solid-State Circuits, vol. 37, No. 1, Jan. 2002; pp. 18-26.
A 27-mW CMOS Fractional-N Synthesizer Using Digital Compensation for 2.5-Mb/s GFSK Modulation; Michael H. Perrott, Student Member, IEEE, Theodore L. Tewksbury III, Member, IEEE, and Charles G. Sodini, Fellow, IEEE; IEEE Journal of Solid-State Circuits, vol. 32, No. 12, Dec. 1997; pp. 2048-2060.
A 6-bit 1.2-GS/s Low-Power Flash-ADC in 0.13μm Digital CMOS, Christoph Sandner, Member, IEEE, Martin Clara, Andreas Santner, Thomas Hartig, and Franz Kuttner; EEE Journal of Solid-State Circuit, vol. 40, No. 7, Jul. 2005, pp. 1499-1505.
A Digitally Controlled Oscillator in a 90 nm Digital CMOS Process for Mobile Phones; Robert Bogdan Staszewski, Member, IEEE, Chih-Ming Hung, Member, IEEE, Nathen Barton, Meng-Chang Lee, Member, IEEE, and Dirk Leipold; IEEE Journal of Solid-State Circuits, vol. 40, No. 11, Nov. 2005; pp. 2203-2211.

* cited by examiner

Primary Examiner—Davis Mis

(57) ABSTRACT

An apparatus includes a phase locked loop (PLL). The phase locked loop (PLL) has coarse tuning (CT), fine tuning-integer (FT-i), fine tuning fractional (FT-f), frequency modulator tuning-fractional (FMT-f), and narrowband (NB) modes of operation.

30 Claims, 7 Drawing Sheets

APPARATUS AND METHODS FOR MIXED ANALOG-DIGITAL FREQUENCY SYNTHESIZING AND MODULATION

CROSS-REFERENCE TO RELATED APPLICATIONS

This application claims priority to, and incorporates by reference, U.S. Provisional Patent Application Ser. No. 60/950,692, filed on Jul. 19, 2007, titled "Methods of and Apparatus for Mixed Analog-Digital Frequency Synthesizing and Modulation,".

TECHNICAL FIELD

The disclosed concepts relate generally to generating electrical signals and, more particularly, to apparatus for frequency synthesizing and modulating electrical signals, and associated methods.

BACKGROUND

Conventional phase locked loop (PLL) circuits fall generally into two categories: analog and digital. Both PLL categories suffer from drawbacks.

Fully analog PLLs typically include a phase frequency detector (PFD), a charge pump (CP), a divider, and an analog loop filter for settling a control voltage that is supplied to, and controls, a voltage controlled oscillator (VCO). When used for frequency synthesis, analog techniques suffer from the following drawbacks: large area of the passive components of the loop filter, and conflict between noise performance (requiring narrow band circuits) and settling time (requiring wide band circuits). When used for phase or frequency modulation, analog techniques also have shortcomings. As one example, analog techniques do not allow direct modulation of the VCO because of the large variations of the VCO gain over process, temperature and frequency.

In an effort to overcome the drawbacks of the fully analog PLLs, fully digital PLLs have been proposed. Typically, digital PLLs include digital filters, time to digital converters (TDC), and high order rate sigma/delta (SD) converters. In addition to relatively high cost, fully digital PLLs suffer from slow acquisition and settling time, higher noise levels, limited frequency resolution, and high complexity.

SUMMARY

The disclosed concepts relate generally to generating electrical signals and, more particularly, to apparatus for frequency synthesizing and modulating electrical signals by using the disclosed novel phase locked loop. In one exemplary embodiment, an apparatus includes a PLL according to the disclosed concepts. The PLL has coarse tuning (CT), fine tuning-integer (FT-i), fine tuning fractional (FT-f), frequency modulator tuning-fractional (FMT-f), and narrowband (NB) modes of operation.

In another illustrative embodiment, a PLL includes an analog to digital frequency converter (ADFC). The ADFC converts an input signal to an output signal, where the output signal has a desired frequency. The conversion is performed independently or substantially independently of process, voltage, and temperature (PVT) variations.

In yet another exemplary embodiment, method of operating a PLL includes generating an output signal of the PLL with a frequency that depends on a control signal of the PLL. The output signal is generated by selectably operating the PLL in coarse tuning (CT), fine tuning-integer (FT-i), fine tuning fractional (FT-f), frequency modulator tuning-fractional (FMT-f), and narrowband (NB) modes of operation.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The concepts disclosed in this patent application relate generally to generating electrical signals and, more particularly, to apparatus for frequency synthesizing and modulating electrical signals, and associated methods. More specifically, the disclosed concepts provide mixed analog-digital circuitry and methods for frequency synthesizing, modulating, or both, of electrical signals.

The mixed analog-digital nature of the disclosed concepts overcome the classical limitations of both the fully digital implementations (i.e., high complexity, slow acquisition, and high noise) and the fully analog implementation (i.e., large area, sensitivity to process voltage and temperature variations and incompatibility with sub-micron digital complementary metal oxide semiconductor (CMOS) process). Thus, the disclosed concepts provide an improved technique for frequency synthesis and/or modulation.

Generally speaking, the disclosed concepts relate to a PLL circuit that has a variable output frequency. The disclosed concepts build upon the frequency synthesis techniques in Published U.S. Patent Application No. 20070040617 to Koukab et al., incorporated by reference here in its entirety.

The concepts disclosed in this patent specification provide techniques for controlling the output frequency of the PLL with high precision, and also to enable digital frequency modulation. In one aspect, a novel circuit for a high resolution gain mode switcher (HR-GMS) is disclosed. A combination of several techniques, including averaging, interpolation, multiple gain stages, and front to back scaling, the HR-GMS circuit significantly decreases the quantization error. In effect, the HR-GMS circuit makes the conversion independent of (or substantially independent of) process, voltage, and temperature (PVT) variations, and achieves a high resolution (e.g., more than 10 bits) at the cost of a relatively small added power and complexity.

The disclosed concepts also include a novel circuit for lowering arbitrarily the effective capacitance beyond the process limit (i.e., below the limit imposed by the semiconductor fabrication process used), and a technique to linearize the variations of the effective capacitance. With this new approach, a resolution as fine as a few Hertz can be achieved with negligible extra cost or quality factor degradation.

In addition, the disclosed concepts provide a novel calibration circuit for just-in-time VCO gain estimation. The VCO gain can be estimated quickly with a precision of 1-2 percent, typically on the order of a few microseconds. As persons of ordinary skill in the art who have the benefit of the description of the disclosed concepts understand, precise estimation of the gain of the VCO is fundamental to achieving a fully digital frequency modulation circuit.

Figure 1:
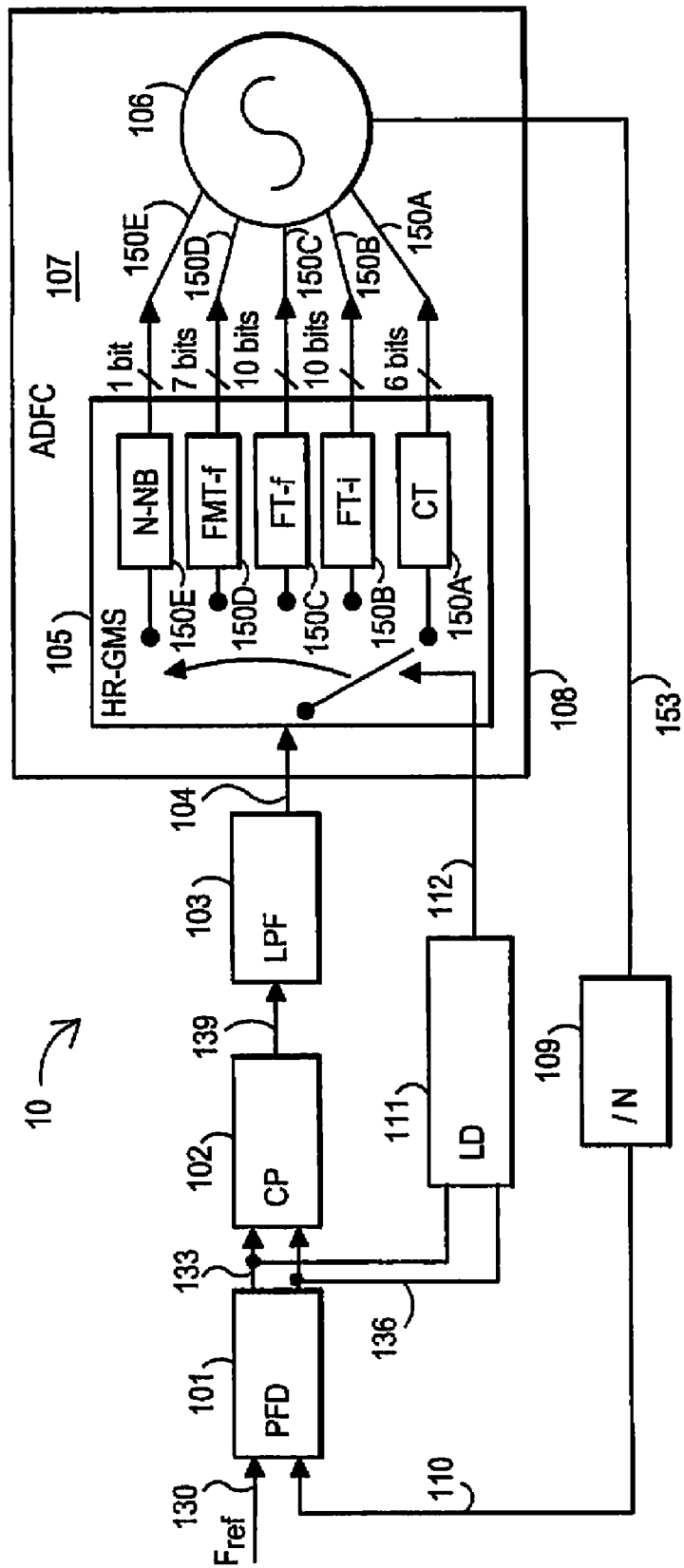
FIG. 1 illustrates a simplified block diagram of a PLL according to an exemplary embodiment.

FIG. 1 illustrates a simplified block diagram of a PLL 10 according to an exemplary embodiment. PLL 10 includes analog to digital frequency converter (ADFC) 107, divider 109, PFD 101, charge pump (CP) 102, loop filter (LPF) 103, lock detector (LD) circuit 111. PFD 101, CP 102, LPF 103, ADFC 107, and divider 109 are arranged in a feedback loop, as persons of ordinary skill in the art who have the benefit of the description of the disclosed concepts understand.

Furthermore, PFD 101, CP 102, LPF 103, lock detector circuit 111, and divider 109 perform the functionality, and have the structure, known to persons of ordinary skill in the art who have the benefit of the description of the disclosed concepts. One may use a variety of circuitry to implement PFD 101, CP 102, LPF 103, lock detector circuit 111, and divider 109, as desired.

ADFC 107 includes high resolution gain mode switcher (HR-GMS) 105 and VCO 106. HR-GMS 105 provides a mechanism for changing the gain of the VCO, and also switches the mode used to control the VCO, as described below in detail. More specifically, HR-GMS 105 includes five additional blocks of circuitry, that is, coarse tuning (CT) circuit 105A, fine tuning-integer (FT-i) circuit 105B, fine tuning-fractional (FT-f) circuit 105C, frequency modulator tuning-fractional (FMT-f) circuit 105D, and normal-narrowband (N-NB) circuit 105E.

Each of the circuit blocks in HR-GMS 105 provides an output signal (or a set of output signals) to VCO 106. In other words, circuits 105A-105E generate, respectively, output signals 150A-150E. Depending on the mode of operation of PLL 10, one of output signals 150A-150E controls VCO 106.

In the illustrative embodiment shown, output signals 150A-150E include, respectively, 6 bits, 10 bits, 10 bits, 7 bits, and 1 bit. One may, however, use other numbers of bits, as desired, depending on the design and performance specifications for a particular implementation.

In response to the appropriate signal among signals 150A-150E, VCO 106 generates an output signal 153 with a desired frequency. Divider 109 receives signal 153 as a feedback signal, and divides the frequency of signal 153, to generate divided feedback signal 110.

PFD circuit 101 compares an input signal 130 with a divided feedback signal 110 (supplied by divider 109) to generate signals 133 and 136. Signals 133 and 136 provide up and down pulses, respectively, which drive two switched current sources in CP 102. The difference between the two pulses (i.e., up and down) is proportional to the phase difference between the signals 130 and 110.

CP 102 receives signals 133 and 136 and, in response, provides signal 139 to LPF 103. LPF 103 filters signal 139 to generate filtered signal 104. Signal 104 is selectively provided to one of the five blocks of circuitry in HR-GMS 105, depending on the mode of operation.

Lock detector circuit 111 receives signals 133 and 136 from PFD 101. Based on signals 133 and 136, lock detector circuit 111 generates output signal 112, which it supplies to LPF 103 and HR-GMS 105. Typically, a high logic level on the lock signal 112 indicates an in-lock state, whereas a low logic level on the lock signal 112 indicates an out-of-lock state. In an in-lock state, the reference signal 130 and the feedback signal 110 are locked in phase.

Conversely, in an out-of-lock state the reference signal 130 and the feedback signal 110 are not locked in phase. Based on the variations of signal 112, one of the blocks of circuitry in HR-GMS 105 is activated or deactivated, as described below in detail.

ADFC 107 essentially constitutes an analog to digital frequency converter able to tune the capacitance of the bank of varactors 203-206 (described below in detail in connection with FIG. 2) and, consequently, the VCO output frequency (F) in an analog mode (i.e., with infinite resolution). ADFC 107 can switch the bank of varactors 203-206 (see FIG. 2) to a digital mode, while keeping the VCO output frequency unchanged or nearly unchanged.

Figure 2:
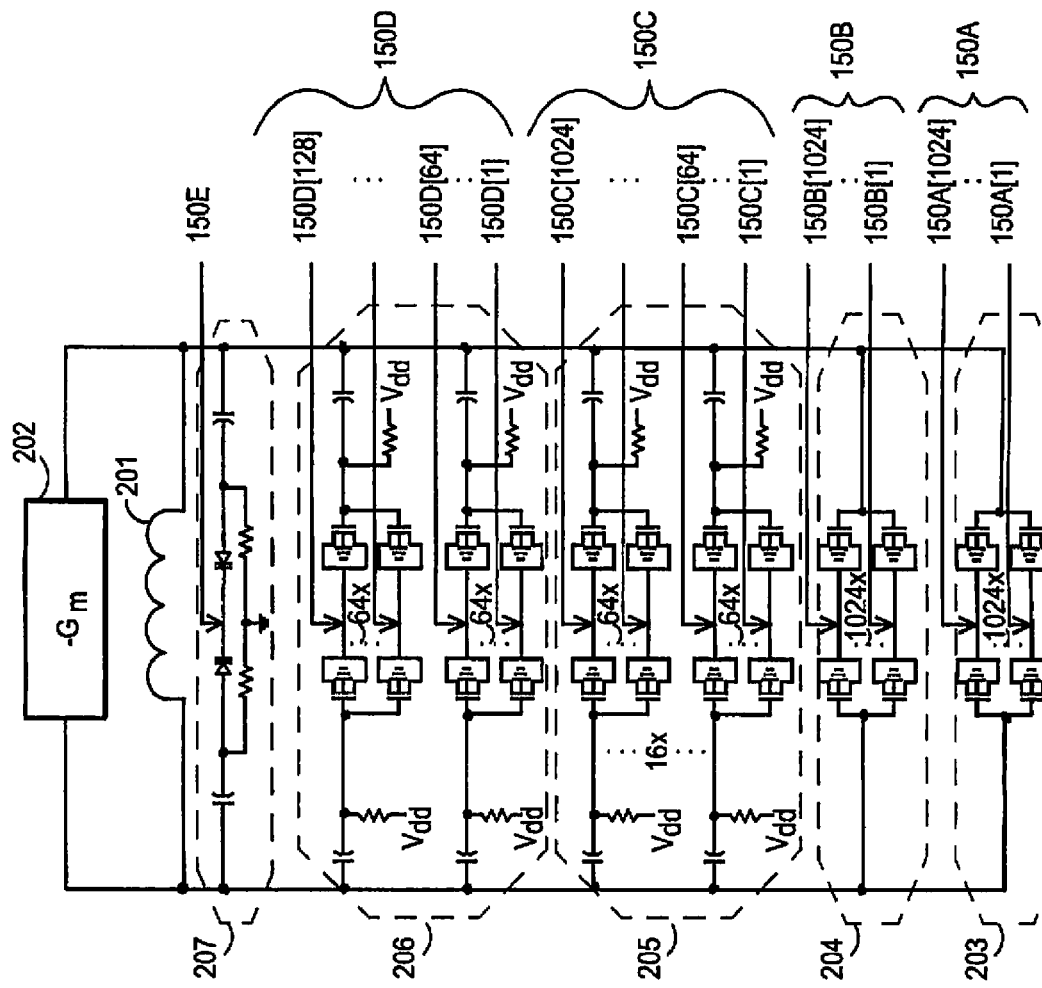
FIG. 2 shows a circuit diagram of the VCO, including banks of varactors, according to an exemplary embodiment.

FIG. 2 shows a circuit diagram of the VCO, including banks of varactors, according to an exemplary embodiment. The bank of varactors is divided into five groups, labeled as 203, 204, 205, 206, 207 in FIG. 2. The five groups of varactors (203, 204, 205, 206, and 207) are controlled respectively by coarse tuning (CT) circuit 105A (via the signals 150A), fine tuning-integer (FT-i) circuit 105B (via the signals 150B), fine tuning-fractional (FT-f) circuit 105C (via the signals 150C), frequency modulator tuning-fractional (FMT-f) circuit 105D (via the signals 150D), and normal-narrowband (N-NB) circuit 105E (via the signal 150E).

Successive approximation (SA) is used until the desired frequency resolution is implemented through HR-GMS 105. More specifically, HR-GMS 105 successively switches the gain of the VCO (Kvco) from a higher value to the next smaller value (via signals 150A-150C, which control groups of varactors 203-205, respectively) in order to achieve VCO lock.

In the example of FIG. 1, the PLL starts in CT mode, and the logic control circuit 328 sets the control signals 323, 324, 325, 326, and 327 (see FIG. 3) to binary values 1, 0, 0, 0, and 0, respectively. The output signals 150A are directly provided to the group of varactors 203. Thus, the capacitance of the group of varactors 203 and, consequently, the VCO output frequency (F), start to be tuned in an analog mode (i.e., with infinite resolution).

At the first in-lock state, the signal 112 is asserted, and the control circuit 328 switches the control signals 323, 324, 325, 326, and 327 (see FIG. 3) to binary values 0, 1, 0, 0, and 0, respectively. The latch array 312 switches the signals 150A and, consequently, the capacitance of the group of varactors 203 to a digital mode, while keeping the VCO output frequency unchanged or nearly unchanged. The same process is repeated at each lock detector (LD) assertion, and HR-GMS 105 adjusts the gain of the VCO by switching from one stage to the other.

In other words, HR-GMS 105 switches from the CT mode (i.e., controlling the group of varactors 203) to the FT-i mode (i.e., controlling the group of varactor 204), and finally to the FT-f mode (i.e., controlling the group of varactor 205). The resolutions of CT, the FT-i, and FT-f modes and the groups of varactors 203-204 are sized to tune the frequency to the desired value with the desired precision.

The CT mode is activated sequentially during the band selection process, and FT-I and FT-f are activated sequentially during the frequency channel selection. The three modes are frozen afterwards (i.e., their respective output signals held constant or steady).

Frequency modulator tuning-fractional mode (FMT-f) is optionally used if one wishes to tune the bank of varactors for frequency modulation. Finally, ADFC 105 switches the operation of PLL 10 to N-NB mode, without changing its frequency. In applications where PLL 10 is used in a radio frequency (RF) apparatus, PLL 10 stays in the N-NB mode during the actual RF transmission or reception.

PLLs according to the disclosed concepts provide a number of advantages over fully analog or fully digital PLLs. In contrast to fully digital solutions, PLLs according to the disclosed concepts perform tuning in analog mode with a wideband PLL configuration, thus avoiding time consuming discrete time tuning, and complex high speed circuits, such as digital signal processors.

In contrast to fully analog solutions, the locking of PLLs according to the disclosed concepts occurs in digital mode. This attribute isolates the VCO from the PLL noise after the frequency tuning, thus high speed wideband PLL configurations with relatively small filter areas can be used during the frequency tuning without appreciable noise performance degradation. The digital locking also provides a way of using the bank of varactors for frequency modulation.

Furthermore, as noted above, switching to the N-NB mode does not result in a frequency shift (or results in a small frequency shift). Thus, no additional time need be allocated for PLL settling. Putting the VCO under the control of the PLL feedback loop helps to prevent the eventual future frequency drifts (e.g., due to temperature, noise, etc.). Because the frequency tuning process is achieved completely by CT circuit 105A, FT-i circuit 105B, and FT-f circuit (105C) and their respective groups of varactors (203-206), a relatively small VCO gain with a small varactor 207 and, thus, a relatively small loop filter, are sufficient to ensure proper operation in the N-NB mode.

Figure 3:
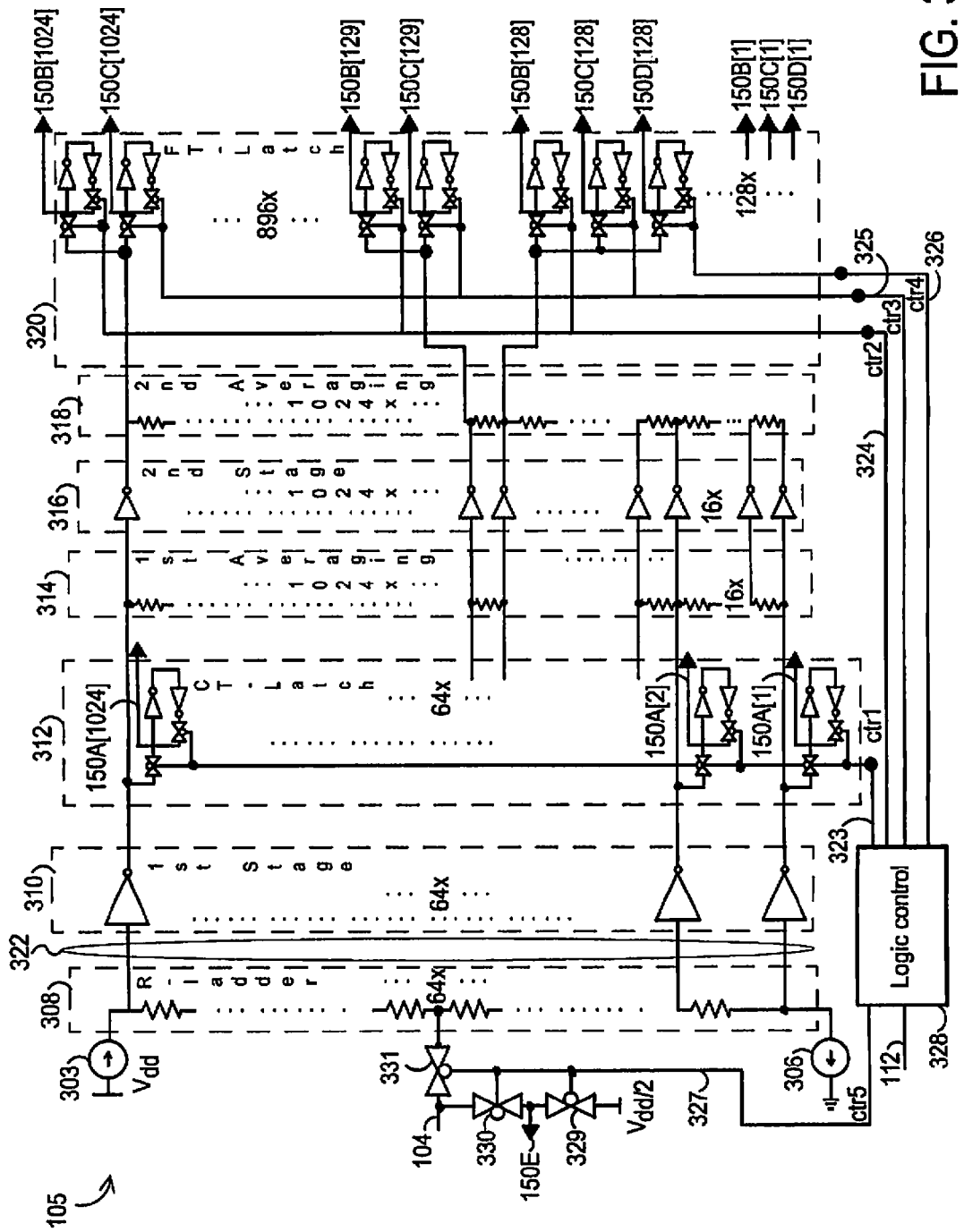
FIG. 3 illustrates a simplified partial block diagram of a high resolution gain mode switch according to an exemplary embodiment.

FIG. 3 illustrates a simplified partial block diagram of an exemplary embodiment of HR-GMS 105. HR-GMS 105 may be used in ADFC 107 of FIG. 1. HR-GMS 105 includes a resistor ladder 308, first inverter stage 310, CT latch 312, averaging circuit 314, second inverter stage 316, second averaging circuit 318, FT latch 320, and a logic control circuit 328.

The CT circuit consists of a resistor ladder (R-ladder) 308 and associated current sources 306 and 303, an array of inverters 310, an array of latches 312, and an array of resistors 314 for averaging. The array of latches 312 provides outputs 150A. The CT mode of operation is activated and deactivated by logic control circuit 328 via signal 323.

The FT-i circuit consists of resistor ladder (R-ladder) 308 and associated current sources 306 and 303, the first array of inverters 310, the array of resistors 314 for averaging, the second array of inverters 316, a second array of resistors 318 for averaging, and an array of latches 320. The array of latches of 320 provides outputs 150B. The FT-i mode is activated and deactivated by logic control circuit 328 via signal 324.

The FT-f circuit consists of a resistor ladder (R-ladder) 308 and associated current sources 306 and 303, the first array of inverters 310, an array of resistors 314 for averaging, the second array of inverters 316, the second array of resistors 318 for averaging, and the array of latches 320. The array of latches 320 provides outputs 150C. The FT-f mode is activated and deactivated by logic control circuit 328 via signal 325.

The FMT-f circuit consists of resistor ladder (R-ladder) 308 and associated current sources 306 and 303, the first array of inverters 310, the array of resistors 314 for averaging, the second array of inverters 316, the second array of resistors 318 for averaging, and the array of latches 320. The array of latches 320 provides outputs 150D. FT-f is activated and deactivated by logic control circuit 328 via signal 326.

The N-NB circuits consist of the switches 329, 330 and 331. The N-NB mode of operation is activated and deactivated by logic control circuit 328 via signal 327.

From an overall perspective, HR-GMS 105 accepts the tuning signal (Vtun) provided by LPF 103 (i.e., signal 104 in FIG. 1), and uses circuitry with relatively high gain to translate the tuning signal to multiple tuning signals. The multiple tuning signals are converted to digital signals (e.g., signals having binary values of 0 and Vdd) when lock detector circuit 111 asserts its outputs (through logic control circuit 328 and output signals 323, 324, 325, and 326 (labeled "Ctr1," "Ctr2," "Ctr3," and "Ctr4," respectively).

As noted, signal 104 from LPF 103 (not shown explicitly in FIG. 2) feeds resistor ladder 308. Resistor ladder 308 includes a cascade or ladder arrangement of resistors (64 resistors in the example shown), coupled between the supply voltage and ground via current sources 303 and 306, respectively. Resistor ladder 308 in effect develops a set of offset voltage signals 322 and provides voltage signals 322 to first inverter stage 310.

First inverter stage 310 may include the same number of inverters as the number of resistors in resistor ladder 308 (64 in the example shown). Each inverter in first inverter stage 310 accepts as its input a corresponding voltage among voltage signals 322. The output of each inverter in first inverter stage 310 drives a corresponding input of a latch circuit in CT latch 312. CT latch 312 includes the same number of latch circuits as the number of inverters in first inverter stage 310 (64 in the example shown).

When the control signal 323 (Ctr1) has a logic one value, the output of each inverter in first inverter stage 310 is coupled to one signal among the 64 signals 150A, and thus to one varactor in the varactors of the group 203. Thus, when the control signal 323 (Ctr1) has a logic one value, the varactors in the group of varactors 203 are tuned by analog signals.

Conversely, when the control signal 323 switches to a logic zero value, the latch circuits in CT latch 312 latch the output signal of a corresponding inverter in first inverter stage 310, isolate the output signal of the inverter from the corresponding signal among signals 150A, and provide instead the latched signals. Thus, when the control signal 323 (Ctr1) has a logic zero value, the varactors in the group of varactors 203 are frozen by latched signals.

The output signals of the inverters in first inverter stage 310 also couple to averaging circuit 314. In the example shown, 16 lateral resistors are inserted between the outputs of each two neighboring inverters in first inverter stage 310. As a result, averaging circuit 314 includes 1,024 resistors arranged in a ladder or cascade configuration.

The first node of averaging circuit 314 is coupled to the output of the first inverter of inverter stage 310, and so on. Thus, the last node of averaging circuit 314 is coupled to the output of the last inverter of inverter stage 310.

Averaging circuit 314 provides averaged signal values to second inverter stage 316, and to the group of varactors 203. Because of the averaging circuit 314, the current in each averaging resistor of averaging circuit 314 (at the output of each inverter of inverter stage 310) contains a linear contribution from adjacent inverters of inverter stage 310.

Thus, the output voltage of each inverter in 310 is no longer determined that inverter alone, but is influenced by neighboring inverters. As a consequence, the effect of electrical parameter mismatch between inverters is reduced, and the linearity of the ADFC improved.

In addition, the lateral resistors decrease the gain of the inverters, resulting in lower output impedances. Lowering the gain of the inverters enables a smooth variation of the frequency versus the tuning voltage during the analog tuning mode, and thus preserves the stability of the PLL in this mode.

Second inverter stage 316 may include the same number of inverters as the number of resistors in averaging circuit 314 (1,024 in the example shown). Each inverter in second inverter stage 316 accepts as its input a corresponding output of averaging circuit 314. The output signals of the inverters in second inverter stage 316 also couple to averaging circuit 318. The output of each inverter in second inverter stage 316 drives a corresponding input of two latch circuits in Fr latch 320.

The output of each inverter of the first 128 inverters in second inverter stage 316 drives a corresponding input of an additional latch circuit in Fr latch 320. Fr latch 320 includes twice as many latch circuits (2×1,024, or 2,048 in the example shown) as the sum of the number of inverters in second inverter stage 316 and the additional 128 latch circuits.

The latch circuits in FT latch 320 are grouped in three sets. The output of one set of latch circuits provides output signals 150B, the output of the second set of latch circuits provides output signals 150C, and the output of the third set of latch circuits provides output signals 150D of HR-GMS 105.

Use of inverters in HR-GMS 105 provides a number of potential benefits. Inverters have a relatively simple two-transistor configuration. As such, they are simple, fast, easier to match, and consume less power, making them suitable for system on a chip (SOC) applications.

As noted above, HR-GMS 105 uses interpolation techniques. Multiple gain stages, together with interpolation, reduce the number of front-end inverters and the input capacitance. In other words, because of the use of interpolation, each inverter in first inverter stage 310 is used more than once. Specifically, each inverter in first inverter stage 310 drives 16 resistors of averaging circuit 314 and 16 inverters in second inverter stage 316. Thus, each inverter is used 16 times as driver.

In the exemplary embodiment described, the ADFC 107 has 10 bits of resolution at the output of ADFC 107, but only 64 inverters at the input of ADFC 107, instead of 1024 inverter. As a result, the input capacitance is reduced by a factor of 16, thus enabling high speed operation.

Figure 4:
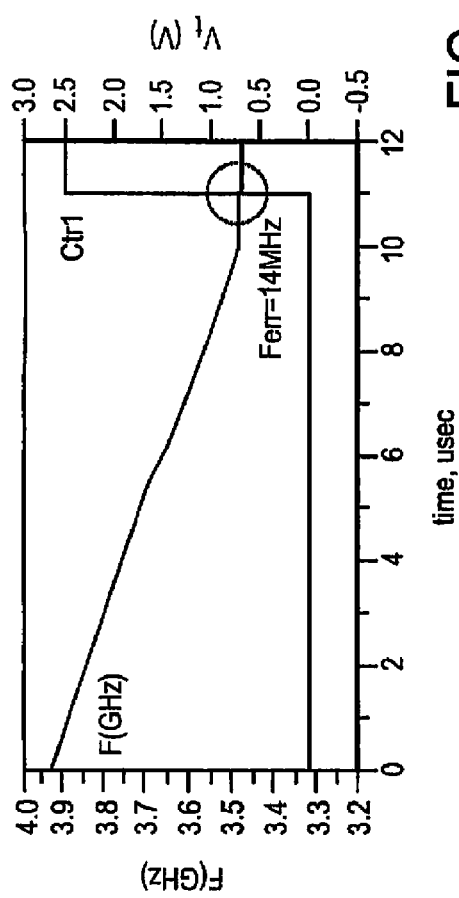
FIG. 4 shows a plot of frequency tuning for the coarse tuning (CT) mode of operation of a PLL according to an exemplary embodiment.

FIG. 4 shows a plot of frequency tuning for one mode of operation of PLL 10 according to an exemplary embodiment. Specifically, FIG. 4 illustrates frequency tuning in the CT mode. The plot shows the VCO output frequency (F), together with control signal Ctr1.

The plot of output frequency corresponds to control signal 104 (Vtun) varying from 0.5 volts to 1 volt. The variation in control signal 104 generates a change in the output frequency from 3.93 GHz to 3.50 GHz. Note that the plot of output frequency shows high linearity, in part because of averaging circuit 314 (see FIG. 3). Note also that assertion of control signal Ctr1 causes a quantization error that gives rise to a frequency error (Ferr) of around 14 MHz.

Figure 5:
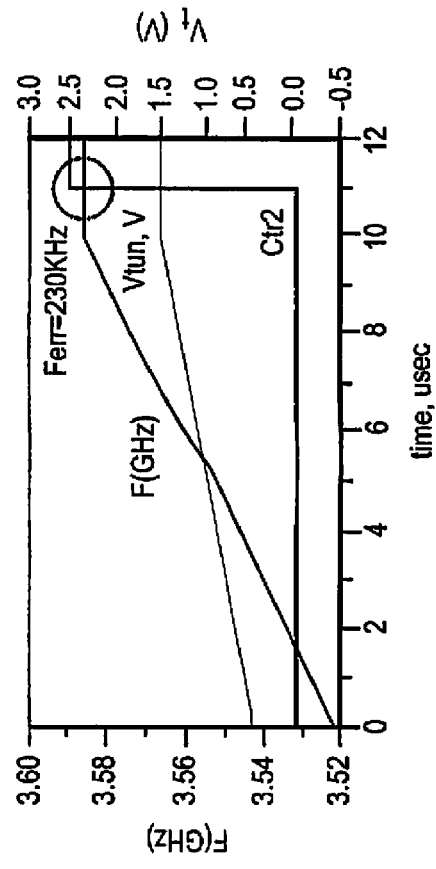
FIG. 5 shows a plot of frequency tuning for the fine tuning-integer (FT-i) mode of operation of a PLL according to an exemplary embodiment.

FIG. 5 shows a plot of frequency tuning for another mode of operation of PLL 10 according to an exemplary embodiment. Specifically, FIG. 5 illustrates frequency tuning in the FT-i mode. The plot shows the VCO output frequency (F), together with control signal Ctr2, and control signal 104 (Vtun).

The plot of output frequency corresponds to control signal 104 (Vtun) varying from 0.5 volts to 1 volt. The variation in control signal 104 generates a change in the output frequency from 3.52 GHz to 3.59 GHz. Note that the plot of output frequency shows high linearity, in part because of averaging circuit 318 (see FIG. 3). The assertion of control signal Ctr2 causes a quantization error that gives rise to a frequency error of around 230 kHz.

Figure 6:
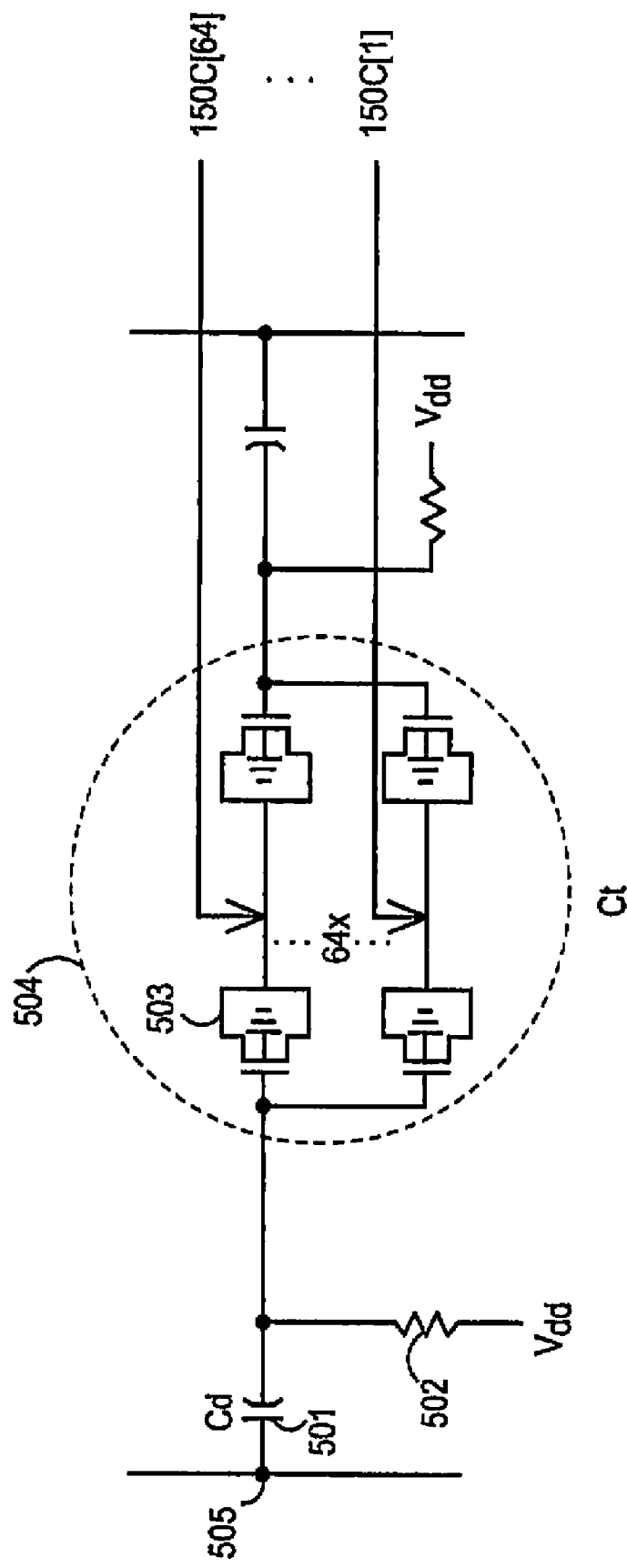
FIG. 6 illustrates a circuit diagram of a portion of a group of varactors used during the fine tuning fractional (FT-f) mode of operation in an exemplary embodiment.

FIG. 6 illustrates a circuit diagram of a portion of the group of varactors used during the fine tuning fractional (FT-f) mode in an exemplary embodiment. Resistor 502 is used to provide a DC voltage (e.g. $V_{dd}$) to the gates of the array of varactors 504. Capacitor 501 is a decoupling capacitor, used to arbitrarily lower the capacitance variation seen at node 505 when one varactor (e.g., varactor 503) of the varactor array 504 is switched on or off.

Assume that $(\Delta C_{FT\text{-}f})_i$ denotes the capacitance variation seen at the node 505 (i.e. at the output of the VCO of FIG. 2) when the $i^{th}$ varactor of the varactor array 504 is switched off. One may express $(\Delta C_{FT\text{-}f})_i$ as:

$$(\Delta C_{FT\text{-}f})_i = \frac{C_d \times C_{ti}}{C_d + C_{ti}} - \frac{C_d \times (C_{ti} - (\Delta C_u)_i)}{C_d + (C_{ti} - (\Delta C_u)_i)} = \frac{C_d^2}{C_{ti}^2}(\Delta C_u)_i,$$

if $C_d \ll C_{ti}$ and $(\Delta C_u)_i \ll C_{ti}$.

In the above equations, $C_{ti}$ represents the capacitance of the varactor array 504 before switching off the $i^{th}$ varactor, Cd denotes the capacitance of decoupling capacitor 501, and $(\Delta C_u)_i$ constitutes the actual capacitance variation of the varactor i when the input voltage (i.e., 150C[i]) of varactor i is switched from logic zero to logic 1 (i.e., $C_{max} - C_{min}$).

As illustrated by the above equations, when Cd is small compared to $C_{ti}$, the capacitance variation seen by the VCO (i.e., $(\Delta C_{FT\text{-}f})_i$), is a fraction of the actual capacitance variation $(\Delta Cu)_i$ of the varactor i. By controlling value of the quadratic coefficient $(C_d/C_{ti})^2$, one may arbitrarily refine the FT-f tuning mode beyond the process limit imposed by the semiconductor fabrication technology used.

Figure 7A:
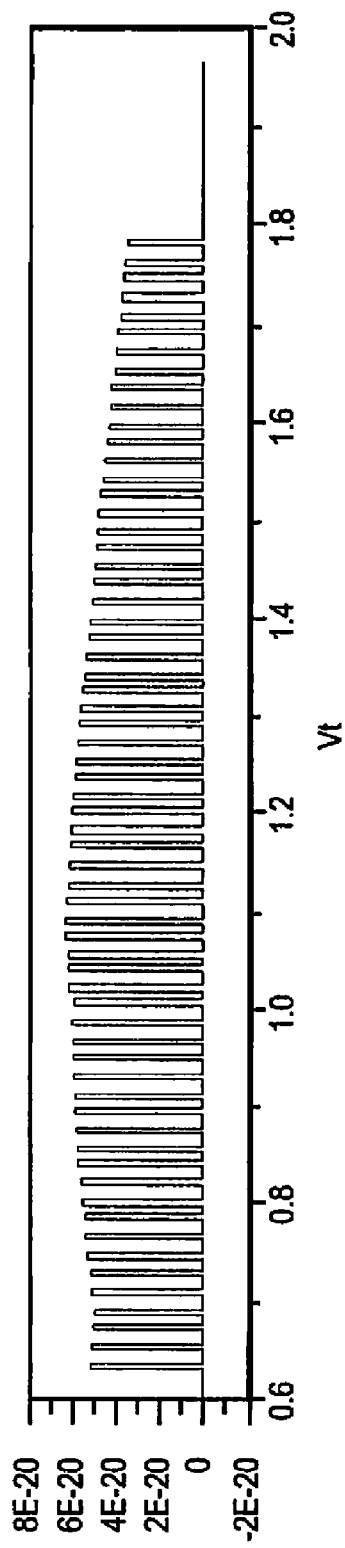
FIGS. 7A and 7B show a plot of a fractional capacitance variations seen by the VCO $(\Delta C_{FT\text{-}f})_i$ and the corresponding VCO fractional frequency variation $(\Delta F_{FT\text{-}f})^i$, respectively, according to an exemplary embodiment.

FIG. 7A shows a plot of the fractional capacitance variations seen by the VCO (i.e., $(\Delta C_{FT\text{-}f})_i$) when the signals 150C[i] at the inputs of the 64 varactors 503[i] are switched from logic 0 to logic 1.

Figure 7B:
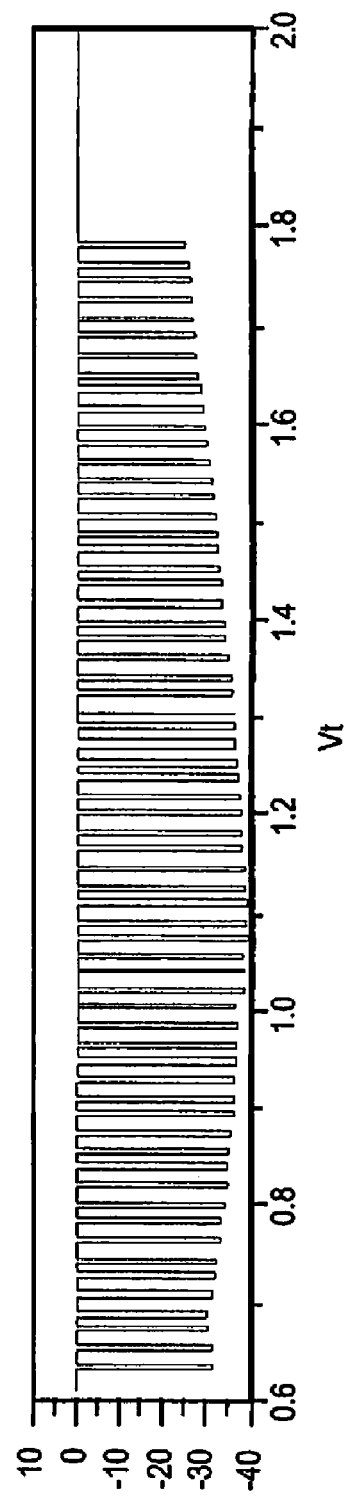

FIG. 7B shows the corresponding VCO fractional frequency variation (i.e., $(\Delta F_{FT\text{-}f})_i$). Note that the plot of fractional frequency variation shows a resolution well beyond the process limit. For example, for a 90-nm fabrication process, the minimum resolution of around 2 GHz achieved with minimum size MOS varactors is around 10 KHz. Using the disclosed techniques, however, a resolution of few Hertz may be achieved by choosing an appropriately small value of the quadratic coefficient $(C_d/C_{ti})^2$.

Figure 8:
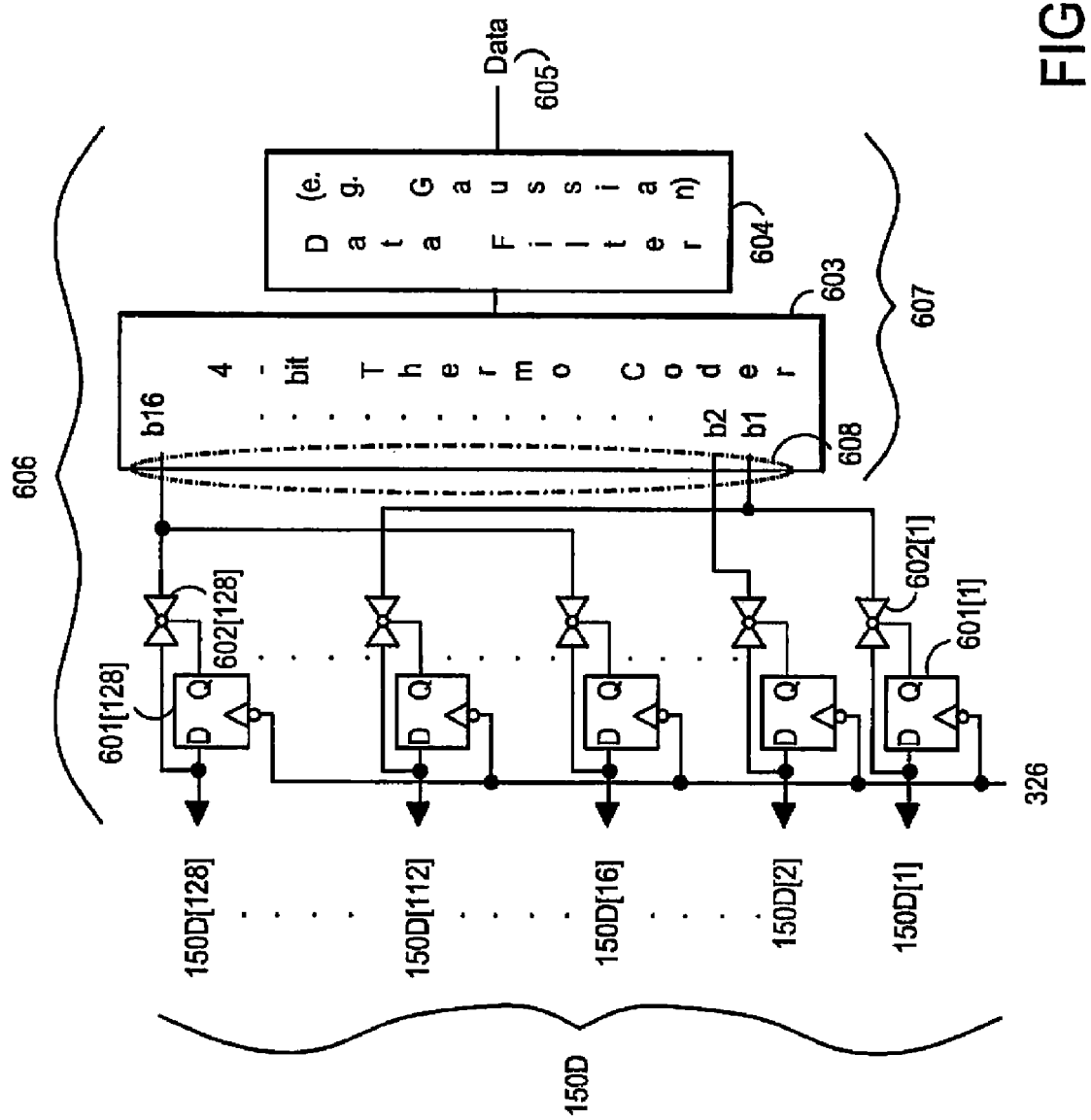
FIG. 8 depicts a circuit diagram for VCO gain calibration and frequency modulation circuitry for the frequency modulator tuning fractional mode (FMT-f).

FIG. 8 illustrates a circuit diagram for VCO gain calibration and frequency modulation circuitry for the frequency modulator tuning fractional mode (FMT-f) according to an exemplary embodiment. The circuit 606 includes an array of 128 registers 601, an array of 128 switches 602, a 4-bit thermo coder 603, and data filter 604 (e.g., a Gaussian filter or other type of filter, depending on the application). The calibration and frequency modulation circuit 606 receives the 128 signals 150D at the input of registers 601.

The registers 601 are clocked by signal 326 of the control logic circuit 328 of the HR-GMS 105 (see FIG. 3). When signal 326 switches to logic 0, signals 150D are provided to the switches 602 via the registers 601. A logic high value of one of the signals 150D, say, signal 150D[i], causes switch 602[i] to close, thus coupling the corresponding node 150D[i] to the corresponding input 608[i] of the coder 604.

The exact VCO gain calibration is achieved by the following steps: (a) incrementing the PLL divider 109 (see FIG. 1) to the desired frequency step, (b) activating the FMT-f circuit 105D to tune the group of varactors 206 via signals 150D in order to achieve the desired frequency step, (c) converting signals 150D to digital values via the array of latches 320 (a signal 150D[i] having a logic value of 1 corresponds to a varactor in the group of varactors 206 that is switched on during the FMT-f tuning), (d) clocking the registers 601, (d) providing the digital signals 150D to the switches 602, (e) closing the switches receiving the signals 150D having a logic value of 1 in order to link the corresponding varactor 206[i] to the input of the of data modulator 607.

The varactors 206[i] that were switched on are equitably distributed on the outputs 608 of the data modulator 607 and are kept coupled to these outputs by the respective registers until the resetting of signal 326. The varactors 206[i] are used by the data modulator 607 to digitally modulate the frequency.

The modulation errors are minimized by averaging (in the example shown, 7 bits, or 128 units) so that varactors 206 are distributed over the 4 bits (16 outputs) 608 of the data modulator 607. In the embodiment shown, desired, one may distribute up to 10 bits fractional varactors units, if desired. Dynamic elements Matching (DEM) can be implemented through cyclic shifting the 16 outputs 608 of the data modulator 607, as desired.

In general, one may apply the disclosed concepts effectively in various applications. Examples include radio-frequency communication, such as cellular telephony, and signal processing.

Referring to the figures, the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosure described in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An apparatus, comprising a phase locked loop (PLL), having coarse tuning (CT), fine tuning-integer (FT-i), fine tuning fractional (FT-f), frequency modulator tuning-fractional (FMT-f), and narrowband (NB) modes of operation.

2. The apparatus according to claim 1, comprising a high resolution gain mode switcher (HR-GMS) adapted to switch modes of operation of the phase locked loop (PLL).

3. The apparatus according to claim 2, wherein the high resolution gain mode switcher (HR-GMS) comprises a first plurality of resistors coupled to a first plurality of inverters.

4. The apparatus according to claim 3, wherein the high resolution gain mode switcher (HR-GMS) further comprises a first plurality of latches coupled to the first plurality of inverters.

5. The apparatus according to claim 4, wherein the high resolution gain mode switcher (HR-GMS) further comprises a first averaging circuit coupled to the first plurality of latches, and a second plurality of inverters coupled to the first averaging circuit.

6. The apparatus according to claim 5, wherein the high resolution gain mode switcher (HR-GMS) further comprises a second averaging circuit coupled to the second plurality of inverters, and a second plurality of latches coupled to the second plurality of inverters.

7. The apparatus according to claim 2, wherein the high resolution gain mode switcher (HR-GMS) reduces a quantization error of the phase locked loop (PLL).

8. The apparatus according to claim 2, wherein the high resolution gain mode switcher (HR-GMS) may be used to digitally frequency-modulate a signal.

9. The apparatus according to claim 1, wherein the phase locked loop (PLL) comprises a plurality of groups of varactors.

10. The apparatus according to claim 1, further comprising a thermo coder, and a data filter coupled to the thermo coder.

11. A phase locked loop (PLL), comprising an analog to digital frequency converter (ADFC) that converts an input signal to an output signal having a pre-determined frequency, wherein the conversion by the analog to digital frequency converter (ADFC) of the input signal is performed substantially independently of process, voltage, and temperature (PVT) variations.

12. The phase locked loop (PLL) according to claim 11, wherein the analog to digital frequency converter (ADFC) lowers an effective capacitance of the phase locked loop (PLL) below a process limit of the phase locked loop (PLL).

13. The phase locked loop (PLL) according to claim 12, wherein the analog to digital frequency converter (ADFC) linearizes variations of the effective capacitance of the phase locked loop (PLL).

14. The phase locked loop (PLL) according to claim 11, wherein the phase locked loop comprises a voltage controlled oscillator (VCO).

15. The phase locked loop (PLL) according to claim 14, wherein the phase locked loop further comprises a calibration circuit for the voltage controlled oscillator.

16. The phase locked loop (PLL) according to claim 15, wherein the calibration circuit provides just-in-time gain estimation for the voltage controlled oscillator.

17. The phase locked loop (PLL) according to claim 11, wherein the analog to digital frequency converter (ADFC) comprises a high resolution gain mode switcher (HR-GMS).

18. The phase locked loop (PLL) according to claim 17, wherein the high resolution gain mode switcher (HR-GMS) provides coarse tuning (CT), fine tuning-integer (FT-i), fine tuning fractional (FT-f), frequency modulator tuning-fractional (FMT-f), and narrowband (NB) modes of operation.

19. The phase locked loop (PLL) according to claim 18, wherein the modes of operation of the high resolution gain mode switcher (HR-GMS) are selected to control a voltage controlled oscillator.

20. A method of operating a phase locked loop (PLL), the method comprising generating an output signal of the phase locked loop (PLL), the output signal having a frequency that depends on a control signal of the phase locked loop (PLL), wherein the output signal is generated by selectably operating the phase locked loop (PLL) in coarse tuning (CT), fine tuning-integer (FT-i), fine tuning fractional (FT-f), frequency modulator tuning-fractional (FMT-f), and narrowband (NB) modes of operation.

21. The method according to claim 20, wherein deriving the control signal of the phase locked loop (PLL) further comprises using a phase frequency detector (PFD).

22. The method according to claim 21, wherein deriving the control signal of the phase locked loop (PLL) further comprises using a charge pump and a filter to generate the control signal.

23. The method according to claim 20, selectably operating the phase locked loop (PLL) in coarse tuning (CT), fine tuning-integer (FT-i), fine tuning fractional (FT-f), frequency modulator tuning-fractional (FMT-f), and narrowband (NB) modes of operation comprises switching the phase locked loop (PLL) from an analog mode to a digital mode.

24. The method according to claim 23, wherein switching the phase locked loop (PLL) from an analog mode to a digital mode comprises using a high resolution gain mode switcher (HR-GMS).

25. The method according to claim 23, wherein the frequency of the output signal remains unchanged during the switching of the phase locked loop (PLL) from the analog mode to the digital mode.

26. The method according to claim 20, further comprising starting the phase locked loop (PLL) in the coarse tuning (CT) mode.

27. The method according to claim 26, further comprising switching the phase locked loop (PLL) from the coarse tuning (CT) mode to the fine tuning-integer (FT-i) mode.

28. The method according to claim 27, further comprising switching the phase locked loop (PLL) from the fine tuning-integer (FT-i) mode to the fine tuning-fractional (FT-f) mode.

29. The method according to claim 28, further comprising switching the phase locked loop (PLL) from the fine tuning-fractional (FT-f) mode to the narrowband (NB) mode.

30. The method according to claim 20, further comprising using switching the phase locked loop (PLL) to the frequency modulator tuning-fractional (FMT-f) to frequency modulate a signal.

* * * * *